(12) United States Patent  
Yamakoshi et al.

(10) Patent No.: US 9,653,270 B2  
(45) Date of Patent: May 16, 2017

(54) METHOD FOR CONNECTING MAGNETIC SUBSTANCE TARGET TO BACKING PLATE, AND MAGNETIC SUBSTANCE TARGET

(75) Inventors: Yasuhiro Yamakoshi, Ibaraki (JP); Kenichi Mogaki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 955 days.

(21) Appl. No.: 12/023,588

(22) Filed: Jan. 31, 2008

(65) Prior Publication Data

US 2009/0008245 A1   Jan. 8, 2009

Related U.S. Application Data

(62) Division of application No. 10/498,146, filed as application No. PCT/JP02/11863 on Nov. 14, 2002, now Pat. No. 7,347,353.

(30) Foreign Application Priority Data

Dec. 19, 2001 (JP) ................................. 2001-385666

(51) Int. Cl.
| | |
|---|---|
| C23C 14/35 | (2006.01) |
| H01J 37/34 | (2006.01) |
| H01J 37/32 | (2006.01) |
| C23C 14/34 | (2006.01) |

(52) U.S. Cl.
CPC ...... *H01J 37/3435* (2013.01); *C23C 14/3407* (2013.01); *H01J 37/3255* (2013.01); *H01J 37/32559* (2013.01); *H01J 37/3414* (2013.01); *H01J 37/3426* (2013.01); *Y10T 428/12465* (2015.01)

(58) Field of Classification Search
CPC ............ H01J 37/32559; H01J 37/3414; H01J 37/3426  
USPC ........................................ 204/298.12, 298.13  
See application file for complete search history.

(56) References Cited

U.S. PATENT DOCUMENTS

| | | | |
|---|---|---|---|
| 4,441,974 A * | 4/1984 | Nishikawa et al. | ..... 204/192.12 |
| 4,831,708 A | 5/1989 | Yoshiwara et al. | |
| 4,957,549 A * | 9/1990 | Matsumoto et al. | ........... 75/246 |
| 5,215,639 A | 6/1993 | Boys | |
| 5,264,050 A | 11/1993 | Nakashima et al. | |
| 5,334,267 A | 8/1994 | Taniguchi et al. | |
| 5,397,050 A | 3/1995 | Mueller | |

(Continued)

FOREIGN PATENT DOCUMENTS

| | | |
|---|---|---|
| EP | 0881311 A1 | 12/1998 |
| JP | 63-118067 A | 5/1988 |

(Continued)

*Primary Examiner* — Jason M Berman  
(74) *Attorney, Agent, or Firm* — Howson & Howson, LLP

(57) ABSTRACT

A method for connecting a magnetic substance target to a backing plate with less variation in plate thickness, characterized in having the steps of connecting the magnetic substance target to an aluminum plate beforehand while maintaining the flatness, connecting the magnetic substance target connected to the aluminum plate to the backing plate while maintaining the flatness, and grinding out the aluminum plate, whereby the flatness of the magnetic substance target can be maintained until the magnetic substance target is connected to the backing plate by a relatively simple operation.

3 Claims, 4 Drawing Sheets

(56) References Cited

U.S. PATENT DOCUMENTS

| | | |
|---|---|---|
| 5,418,071 A * | 5/1995 | Satou et al. .................. 428/552 |
| 5,693,203 A | 12/1997 | Ohhashi et al. |
| 5,964,966 A | 10/1999 | Goyal et al. |
| 6,033,536 A | 3/2000 | Ichihara et al. |
| 6,086,725 A | 7/2000 | Abburi et al. |
| 6,179,976 B1 * | 1/2001 | D'Souza et al. ......... 204/192.15 |
| 6,183,613 B1 | 2/2001 | Gilman et al. |
| 6,190,516 B1 | 2/2001 | Xiong et al. |
| 6,199,259 B1 | 3/2001 | Demaray et al. |
| 6,267,827 B1 | 7/2001 | Shindo et al. |
| 6,283,357 B1 * | 9/2001 | Kulkarni et al. ............. 228/155 |
| 6,485,542 B2 | 11/2002 | Shindo et al. |
| 6,521,108 B1 | 2/2003 | Zhang |
| 6,619,537 B1 | 9/2003 | Zhang et al. |
| 6,759,143 B2 | 7/2004 | Oda et al. |
| 6,793,124 B1 | 9/2004 | Takahashi et al. |
| 6,858,116 B2 | 2/2005 | Okabe et al. |
| 6,875,325 B2 | 4/2005 | Miyashita et al. |
| 6,988,306 B2 * | 1/2006 | Koenigsmann ..... C23C 14/3407 204/192.12 |
| 2004/0256035 A1 | 12/2004 | Yamakoshi et al. |
| 2006/0137782 A1 | 6/2006 | Yamakoshi et al. |
| 2007/0051624 A1 | 3/2007 | Okabe et al. |
| 2008/0116066 A1 | 5/2008 | Miyashita |

FOREIGN PATENT DOCUMENTS

| | | | |
|---|---|---|---|
| JP | 63118067 A * | 5/1988 | |
| JP | 02-011759 A | 1/1990 | |
| JP | 05-003273 A | 1/1993 | |
| JP | 06-128734 A | 5/1994 | |
| JP | 08-246144 A | 9/1996 | |
| JP | 11-131226 A | 5/1999 | |
| JP | 11-200028 A | 7/1999 | |
| JP | 2001-214265 A | 8/2001 | |

* cited by examiner

METHOD FOR CONNECTING MAGNETIC SUBSTANCE TARGET TO BACKING PLATE, AND MAGNETIC SUBSTANCE TARGET

CROSS REFERENCE TO RELATED APPLICATIONS

This application is a divisional of U.S. application Ser. No. 10/498,146, which is the National Stage of International Application No. PCT/JP02/11863, filed Nov. 14, 2002, which claims the benefit under 35 USC 119 of Japanese Application No. 2001-385666, filed Dec. 19, 2001.

BACKGROUND OF THE INVENTION

The present invention pertains to a method for connecting a magnetic substance target with less variation in plate thickness to a backing plate, and to the magnetic substance target itself.

Conventionally, when performing magnetron sputtering to a ferromagnetic substance target such as iron, cobalt, nickel, platinum or the alloys thereof upon disposing a magnet to the back of such a target, the magnetic field inside the target was blocked, and it was difficult to generate a magnetic field on the target surface.

In other words, as a result of the magnetic field effect characteristic to ferromagnetic bodies such as iron, cobalt, nickel, platinum or the like, the plasma density did not rise, the ionization efficiency of argon deteriorated, and, as a result, the sputtering efficiency became deteriorated.

Thus, upon employing a ferromagnetic substance target such as iron, cobalt, nickel, platinum or the alloys thereof, measures were taken to generate a magnetic field leak by simply making the target thickness thin.

Generally, for the conventional connection of a magnetic substance target and a backing plate, a low-melting bonding material such as indium or the like was used.

Nevertheless, recently, this type of bonding material such as indium with weak bonding strength sometimes peels due to the influence of heat generated when latest high-power sputtering is employed. Thus, diffusion bonding has been proposed instead of this kind of bonding material, and, today, this diffusion bonding is becoming mainstream.

In light of the above, this is no exception to targets such as iron, cobalt, nickel, platinum and the alloys thereof, and diffusion bonding is similarly being performed thereto.

Meanwhile, although aluminum or aluminum alloy is generally used as the backing plate, when using such aluminum or aluminum alloy, the difference in the coefficient of thermal expansion between iron, cobalt, nickel, platinum or the alloys thereof and the aluminum or aluminum alloy will become significant, and, as a result, there were cases where the bonding interface would peel due to the increase in the cambering amount during the cooling process after diffusion.

In recent years, sputtering particles are being ionized with further high-power sputtering so as to perform even deposition while providing high kinetic energy to the substrate. As a result, the target to which the backing plate is connected deforms significantly in a convex shape due to the thermal influence during sputtering and the water pressure of the cooling medium, and there were cases where water leakage would occur.

Recently, the target itself is being enlarged pursuant to the enlargement of the bore diameter of wafers, and the peeling of the bonding interface and the deformation of the backing plate are becoming major problems. In consideration of the above, copper and copper alloy having stronger strength are being used as the backing plate.

Incidentally, with the ferromagnetic substance targets formed from iron, cobalt, nickel, platinum or the alloys thereof as described above, in order to provide anisotropy to magnetism of the ferromagnetic substance target, complete annealing will not be performed thereto after final plastic working, and it is necessary to leave in the as-wrought structure the processing stress caused by the plastic working.

Although it is one characteristic of a ferromagnetic substance target to have such remnant stress, a major problem here is in that the remnant stress may cause cambering in the ferromagnetic substance target material such as iron, cobalt, nickel, platinum or the alloys thereof during the bonding process to the backing plate. For instance, although heat of roughly 200 to 250° C. will be applied during the bonding process, cambering will occur even with the application of heat at such lower temperatures.

In order to improve the sputtering efficiency of the magnetron sputtering target as described above, a target material having a thickness of 10 mm or less, generally 5 mm or less is formed, but cambering appears notably with such a thin target, and there is a problem in that this is extremely difficult to restore.

Generally, a ferromagnetic substance target formed from iron, cobalt, nickel, platinum or the alloys thereof is ultimately retained in a vacuum chuck and subject to grinding. Even if the flatness thereof is maintained during the retention in such chuck, if cambering occurs even once, a phenomenon of re-cambering may occur after the release of the chuck.

As described above, since a target material is thin, the problem of cambering is serious, and there is a problem in that such target material cannot be easily connected to the backing plate while maintaining the flatness thereof.

SUMMARY OF THE INVENTION

In light of the above, an object of the present invention is to provide a method for connecting a backing plate and a magnetic substance target in which the flatness of the magnetic substance target can be maintained until the magnetic substance target is connected to the backing plate by a relatively simple operation, as well as a magnetic substance target with less variation in plate thickness and leakage flux.

As a result of conducting intense study, the present inventors have discovered that a disposable retention plate may be used to prevent cambering.

Based on the foregoing discovery, the present invention provides a method for connecting a magnetic substance target with less variation in plate thickness and a backing plate, comprising the steps of connecting the magnetic substance target to an aluminum plate beforehand while maintaining the flatness, connecting the magnetic substance target connected to the aluminum plate to the backing plate while maintaining the flatness, and grinding out the aluminum plate after the connection of the magnetic substance target to the backing plate.

The magnetic substance target can be iron, cobalt, nickel, platinum or the alloys thereof, and the backing plate can be copper, copper alloy, aluminum or aluminum alloy. Preferably, the magnetic substance target and backing plate are connected via bonding or diffusion bonding, and the diffusion bonding is performed via an insert material such as an aluminum or aluminum alloy plate. Further, after grinding out the aluminum plate, the magnetic substance surface is preferably further ground.

According to another aspect of the present invention, a magnetic substance target is provided in which the thickness displacement in relation to the average thickness is 4% or less.

According to yet another aspect of the present invention, a magnetic substance target is provided in which, when the maximum leakage flux of the target is 100%, the average leakage flux in relation to the maximum leakage flux is 80% or more, or the minimum leakage flux in relation to the maximum leakage flux is 70% or more.

DETAILED DESCRIPTION OF THE INVENTION

Figure 1:
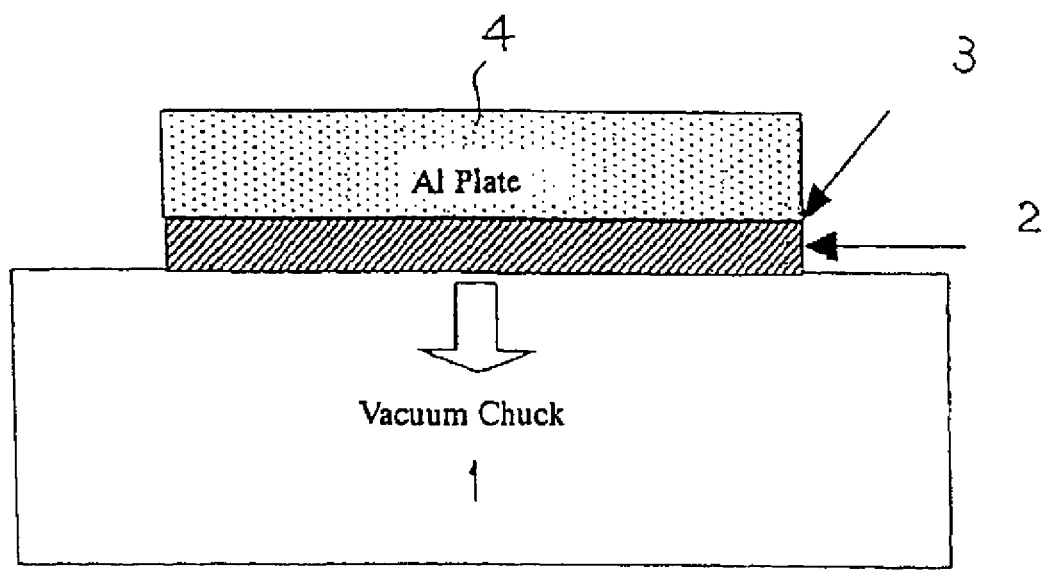
FIG. 1 is an explanatory diagram showing the cross section of a case where a high purity cobalt target is placed on a vacuum chuck while maintaining a state of flatness, and an aluminum plate being connected thereto via an adhesive material.

In a method of forming an assembly comprising a magnetic substance target and a backing to the present invention, a magnetic substance target such as iron, cobalt, nickel, platinum or the alloys thereof (Fe—Ni alloy, Co—Ni alloy, Mn—Pt alloy, etc.) is first bonded to an aluminum plate with the explosive bonding method, diffusion bonding method, brazing method, or other bonding methods while maintaining the flatness thereof by using a vacuum chuck or the like.

As the method of bonding to this aluminum plate, it will suffice so as long as the bonding strength is sufficient at 250° C., and it is important that adverse effects are not inflicted upon the target. As such a method, explosive bonding method, diffusion bonding method, brazing method, or other bonding methods (adhesive methods) may be used. There is no particular limitation on these bonding methods, adhesives, and materials used for bonding.

The aluminum plate is in other words a reinforcing plate or protective plate for preventing cambering of the target plate bonded thereto. The aluminum plate used here includes an aluminum alloy plate, and an inexpensive material may be used since it will be ground off later in the process.

In order to maintain the flatness of the magnetic substance target, a certain degree of strength and thickness is required in the aluminum plate. Although it is appropriate to use an aluminum plate having a thickness that is the same as or greater than the magnetic substance target, since the thickness of this aluminum plate may also be arbitrarily changed depending on the strength of amount of cambering of the magnetic substance target, there is no particular limitation on the thickness, and may be suitably selected.

Next, the magnetic substance target of the present invention as-bonded to the aluminum plate is bonded to the backing plate while maintaining the flatness thereof. Here, this may be connected with conventional bonding, or connected with diffusion bonding.

For example, when bonding with indium or indium alloy, a temperature of 200 to 250° C. is applied, and it is necessary to make sure that the foregoing aluminum plate or bonding material has resistance characteristics against this temperature during the connection and that cambering or the Like does not occur.

Since the temperature becomes relatively high during diffusion bonding, resistance characteristics against high temperatures are required. For example, in the case of a cobalt target, since low magnetic permeability must be maintained, there is a limitation that the diffusion bonding must be conducted at a low temperature (450° C. or less), but it is still necessary to apply heat up to a temperature of several hundred degrees.

Upon performing diffusion bonding, it is effective to use indium, or the alloy thereof, or other low-melting insert materials which have a certain degree of thickness. In some cases, aluminum or aluminum alloy may also be used. The function of the foregoing insert material is in that diffusion bonding is enabled at low temperatures, and that the insert material alleviates the stress generated by the difference of thermal expansion between the target and backing plate after the diffusion bonding until it is cooled to room temperature.

It is preferable to use copper or copper alloy or aluminum or aluminum alloy which have stronger strength as the backing plate. For instance, in terms of a backing plate with less cambering during bonding and which does not deform even during high power sputtering, it is effective to use copper alloys such as copper chrome alloy or copper zinc alloy as the backing plate.

As described above, whether in the case of bonding or diffusion bonding, since the surface of the magnetic substance is covered with an aluminum plate (reinforcing plate or protective plate) via an adhesive material, the magnetic substance may be operated without being damaged by using the above as a protective plate during bonding until the completion of the connection of the magnetic substance to the backing plate, and, this may also be pressed when necessary.

After the magnetic substance target is bonded to the backing plate, the aluminum plate as the reinforcing plate and the adhesive material are ground off. Substances generated through the explosive bonding, diffusion bonding method, brazing, or other bonding or adhesive method to the aluminum plate, and that is, the bonding or adhesive material and substances left or generated at the interface between the magnetic substance target and the aluminum plate are all eliminated together with the aluminum plate.

In this stage, since the magnetic substance target is connected to the backing plate formed from the likes of aluminum alloy or copper alloy having stronger strength, the flatness thereof may be maintained without change. After the grinding out of the aluminum plate and bonding material, the magnetic substance surface may be further ground.

FIG. 1 is an explanatory diagram showing the cross section of a case where a high purity cobalt target 2 is placed on a vacuum chuck 1 while maintaining a state of flatness, and an aluminum plate 4 being connected thereto via an bonding material 3.

Figure 2:
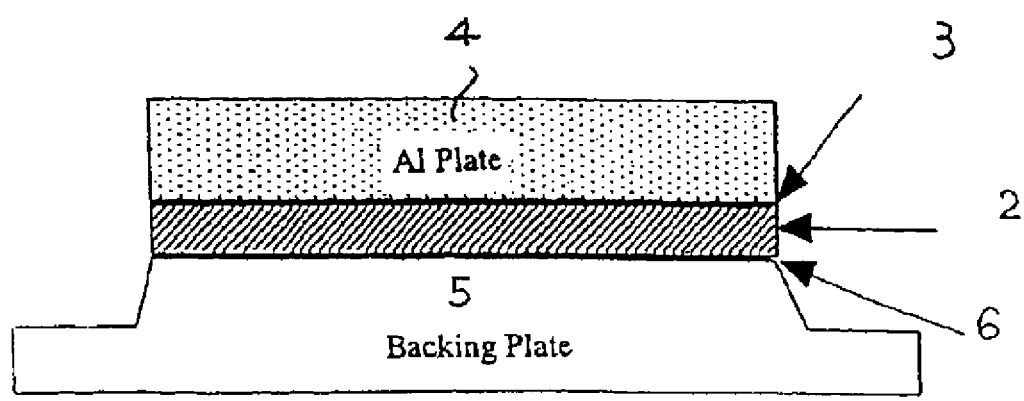
FIG. 2 is an explanatory diagram showing the cross section of a case of connecting a copper alloy backing plate to a high purity cobalt target, wherein an aluminum plate has been connected hereto via a bonding material.

FIG. 2 is an explanatory diagram showing the cross section of a case of connecting a copper alloy backing plate 5 to a high purity cobalt target 2, wherein an aluminum plate 4 has been connected thereto via a bonding material 3, with a bonding brazing material 6.

As a result of employing the foregoing method for connecting a magnetic substance target to a backing plate, obtained is a magnetic substance target in which a variation in the thickness of the magnetic substance target is 4% or less of an average thickness thereof; the average leakage flux in relation to the maximum leakage flux is 80% or more, preferably 90% or more, when the maximum leakage flux of the target is 100%; and the minimum leakage flux in relation to said maximum leakage flux is 70% or more when the maximum leakage flux of the target is 100% at the respective position across the surface area of the target.

This magnetic substance target may be employed as a magnetic substance of iron, cobalt, nickel, platinum or the alloys thereof.

Further, the leakage flux may be measured upon using a standard gauss meter. In other words, a magnet is placed on the backing plate side, a probe is made to contact the magnetic substance side on the opposite side, and measurement is thereby made with a gauss meter. The position to be measured is performed by arbitrarily moving the probe.

EXAMPLES AND COMPARATIVE EXAMPLES

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.

Example 1

High purity cobalt raw material of 99.999 wt % (5N) was warm rolled at 450° C. to prepare a high purity cobalt plate having a thickness of 6 mm, and this was further machine processed to complete a discoid target having a diameter of φ350 mm and a thickness of 3.5 mm.

Copper chrome alloy (chrome content of 1 wt %) was used as the backing plate.

While retaining the high purity cobalt plate with a vacuum chuck and maintaining the flatness, an aluminum plate of 10 mm was connected to this high purity cobalt plate with PbAgSn brazing material (97.5Pb-1Sn-1.5Ag) at 325° C. After the connection, the target side was surface ground (approximately 0.3 mm) so as to form a flat surface.

Next, indium soldering was used to connect the sputtering target and the backing plate. The heating temperature was 230° C.

Thereafter, the aluminum plate was removed with mechanical processing (grinding), and the cobalt was faced (approximately 0.2 mm) so as to obtain a target-backing plate assembly.

Next, with the discoid cobalt target facing upward, the target thickness was measured with a supersonic thickness indicator. A total of 49 points (1 point in the center, 8 points in ⅓ of the periphery, 16 points in ⅔ of the periphery, and 24 points in the outer periphery) were radially measured.

As a result, the maximum thickness was 3.06 mm, the minimum thickness was 2.90 mm, and the displacement from the target thickness was 0.1 mm (3.3%) at maximum. Further, the difference between the maximum thickness and minimum thickness was 0.16 mm. As described above, the thickness variation was small, the connection status was favorable, and there were no generation of abrasion marks or the like.

Although cambering should occur during the connection of the target to the backing plate or during the processing thereof, this is firmly retained and protected with the aluminum plate via the brazing material. Further, grinding of aluminum and brazing material is easy, and the increase in processing steps or costs was minimal.

Figure 3:
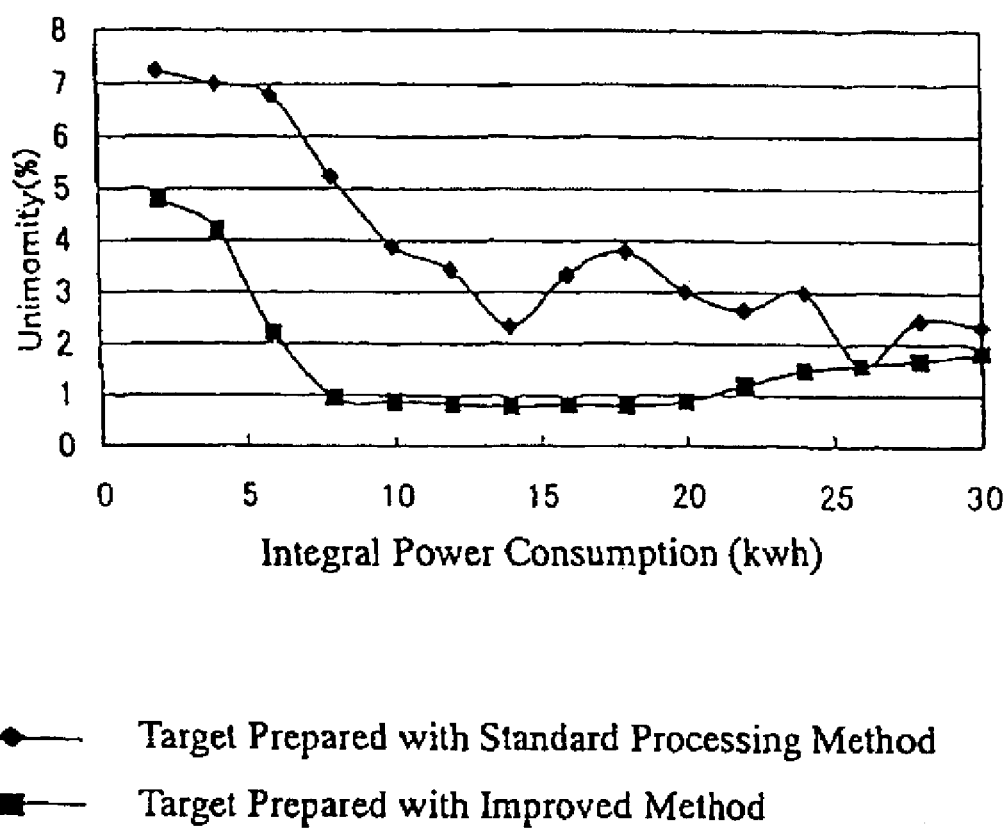
FIG. 3 is a diagram showing the relation between the integral power consumption and uniformity.

Next, the discoid cobalt target-backing plate assembly was used to perform sputtering on a substrate, and the uniformity of the formed cobalt was observed. The results are shown in FIG. 3.

Moreover, the sputtering conditions were as follows:
Applied Power: 1 kw
T-S: 50 mm
Film Thickness: 1000 Å
Ar Pressure: $9 \times 10^{-3}$ Torr As shown in FIG. 3, the uniformity begins to improve from around an integral power consumption of approximately 6 kwh, this is maintained at a uniformity of 2% or less up to an integral power consumption of approximately 30 kwh, and this shows that the uniformity of the film formed with sputtering is favorable. This is considered to be a result of the variation in the target thickness being small, and the flatness being superior.

Comparative Example 1

With the same method as Example 1, high purity cobalt raw material of 99.999 wt % (5N) was warm rolled at 450° C. to prepare a high purity cobalt plate having a thickness of 6 mm, and this was further machine processed to complete a discoid target having a diameter of φ350 mm and a thickness of 3.0 mm. Copper chrome alloy (chrome content of 1 wt %) was used as the backing plate, and indium soldering was used to directly connect the sputtering target and backing plate. The heating temperature was 230° C.

Next, similar to Example 1, with the discoid cobalt target facing upward, the warp amount was measured with a supersonic thickness indicator. A total of 49 points (1 point in the center, 8 points in ⅓ of the periphery, 16 points in ⅔ of the periphery, and 24 points in the outer periphery) were radially measured.

As a result, the maximum thickness was 3.12 mm, the minimum thickness was 2.78 mm, and the displacement from the target thickness was 0.22 mm (7.3%) at maximum. Further, the difference between the maximum thickness and minimum thickness was 0.34 mm.

As described above, the warp amount was significantly large, and there were generation of abrasion marks and the like. This is considered to be because since a reinforcing aluminum plate is not provided, significant cambering occurred during the connection of the sputtering target and backing plate, and, since grinding was conducted with the existence of such camber, the center portion became thin and the outer portion became thick (the opposite for the grinding side).

Next, the discoid cobalt target-backing plate assembly was used to perform sputtering on a substrate, and the uniformity of the formed cobalt was observed. The results are similarly shown in FIG. 3 in comparison to Example 1.

Incidentally, the sputtering conditions were the same as Example 1.

As shown in FIG. 3, uniformity was inferior at roughly 7% even at an integral power consumption of approximately 6 kwh. And, the uniformity exceeded 2% up to an integral power consumption of approximately 30 kwh, and varied.

The reason why the uniformity of the film formed upon sputtering the discoid cobalt target illustrated in the Comparative Example is considered to be because the variation in the target thickness being great, and the flatness being inferior.

Example 2

High purity nickel raw material of 99.999 wt % (5N) was warm rolled at 450° C. to prepare a high purity nickel plate having a thickness of 6 mm, and this was further machine processed to complete a discoid target having a diameter of φ350 mm and a thickness of 3.5 mm. Copper chrome alloy (chrome content of 1 wt %) was used as the backing plate.

While retaining the high purity nickel plate with a vacuum chuck and maintaining the flatness, an aluminum plate of 10 mm was connected to this high purity nickel plate with PbAgSn brazing material (97.5Pb-1Sn-1.5Ag) at 325° C. After the connection, the target side was surface ground (approximately 0.3 mm) so as to form a flat surface.

Next, indium soldering was used to connect the sputtering target and the backing plate. The heating temperature was 230° C.

Thereafter, the aluminum plate was removed with mechanical processing (grinding), and the nickel was faced (approximately 0.2 mm) so as to obtain a target-backing plate assembly.

Next, with the discoid nickel target facing upward, the target thickness was measured with a supersonic thickness indicator. A total of 25 points (1 point in the center, 8 points in ⅓ of the periphery, and 16 points in ⅔ of the periphery) were measured for each prescribed angle (θ) radially from the center thereof. The results are shown in Table 1. Further, the graph corresponding to Table 1 is shown in FIG. 4.

Figure 4:
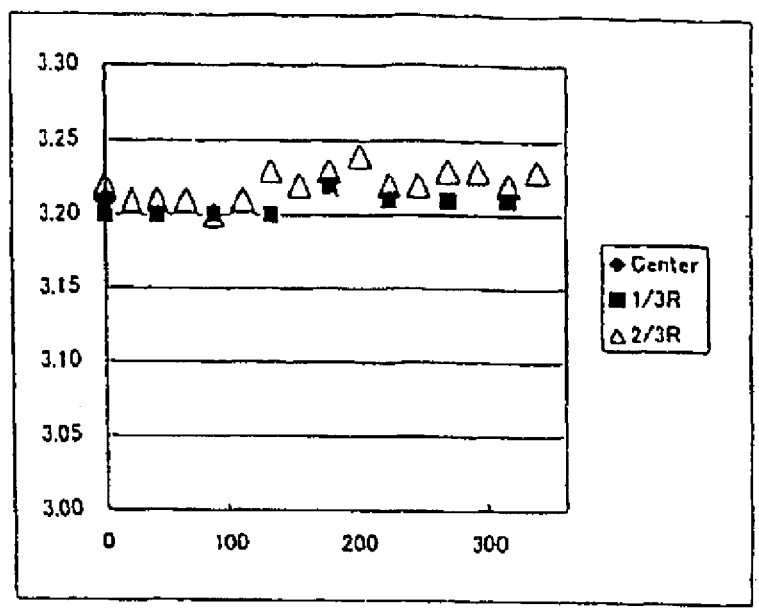
FIG. 4 is a diagram showing the results upon measuring the thickness of the nickel target in the case of employing an aluminum plate (reinforcing plate) at a total of 25 points for each prescribed angle ($\theta$) radially from the center thereof with an ultrasonic thickness indicator.

As a result, as shown in Table 1 and FIG. 4, the maximum thickness was 3.24 mm, the minimum thickness was 3.20 mm, and the average was 3.216 mm. The displacement from the average thickness was 0.024 mm (0.7%) at maximum. Further, the difference between the maximum thickness and minimum thickness was 0.04 mm. As described above, the thickness variation was extremely small, and, as with Example 1, the connection status was favorable, and there were no generation of abrasion marks or the like.

TABLE 1

| θ(deg) | Center | ⅓R | ⅔R |
|---|---|---|---|
| 0 | 3.21 | | |
| 0 | | 3.20 | |
| 45 | | 3.20 | |
| 90 | | 3.20 | |
| 135 | | 3.20 | |
| 180 | | 3.22 | |
| 225 | | 3.21 | |
| 270 | | 3.21 | |
| 315 | | 3.21 | |
| 0 | | | 3.22 |
| 22.5 | | | 3.21 |
| 45 | | | 3.21 |
| 67.5 | | | 3.21 |
| 90 | | | 3.20 |
| 112.5 | | | 3.21 |

TABLE 1-continued

| θ(deg) | Center | ⅓R | ⅔R |
|---|---|---|---|
| 135 | | | 3.23 |
| 157.5 | | | 3.22 |
| 180 | | | 3.23 |
| 202.5 | | | 3.24 |
| 225 | | | 3.22 |
| 247.5 | | | 3.22 |
| 270 | | | 3.23 |
| 292.5 | | | 3.23 |
| 315 | | | 3.22 |
| 337.5 | | | 3.23 |

Next, the leakage flux of this discoid nickel target was measured with a gauss meter. The points measured were the same as the thickness measurement described above. Generally, the larger the leakage flux, the higher the sputtering efficiency, and this is considered to be favorable.

Figure 5:
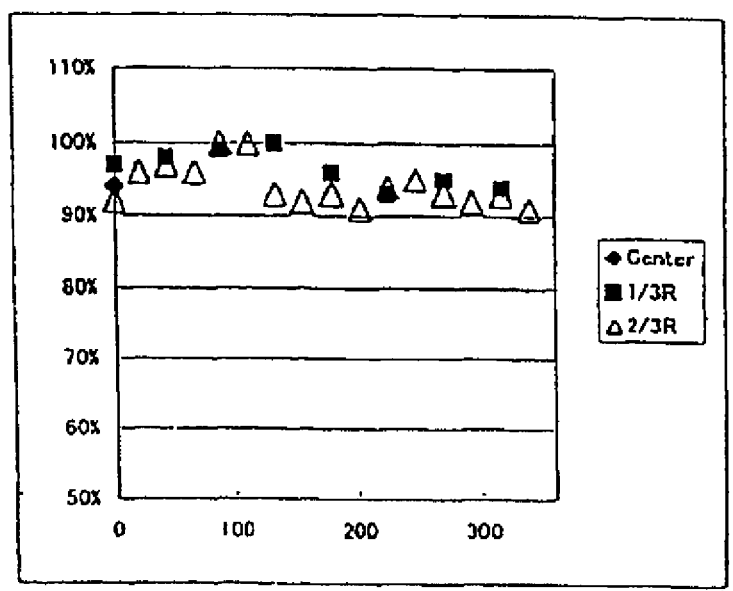
FIG. 5 is a diagram showing the measurement results of the leakage flux of above.

The relative values in the respective measuring points when the strongest value of the leakage flux is 100% were measured. The result was maximum 100%, minimum 91%, and average 95%. The difference between maximum and minimum was 9%. The results are shown in Table 2 and FIG. 5.

In comparison to Comparative Example 2 described later, a result was obtained in that the leakage flux will increase if the change in thickness is small. Further, in the case of nickel, it has become evident that the leakage flux will be influenced significantly due to the variation in thickness.

TABLE 2

| θ(deg) | Center | ⅓R | ⅔R |
|---|---|---|---|
| 0 | 94% | | |
| 0 | | 97% | |
| 45 | | 98% | |
| 90 | | 99% | |
| 135 | | 100% | |
| 180 | | 96% | |
| 225 | | 93% | |
| 270 | | 95% | |
| 315 | | 94% | |
| 0 | | | 92% |
| 22.5 | | | 96% |
| 45 | | | 97% |
| 67.5 | | | 96% |
| 90 | | | 100% |
| 112.5 | | | 100% |
| 135 | | | 93% |
| 157.5 | | | 92% |
| 180 | | | 93% |
| 202.5 | | | 91% |
| 225 | | | 94% |
| 247.5 | | | 95% |
| 270 | | | 93% |
| 292.5 | | | 92% |
| 315 | | | 93% |
| 337.5 | | | 91% |

The strongest value of the leakage flux is indicated as 100%.

Comparative Example 2

With the same method as Example 2, high purity nickel raw material of 99.999 wt % (5N) was warm rolled at 450° C. to prepare a high purity nickel plate having a thickness of 6 mm, and this was further machine processed to complete a discoid target having a diameter of φ350 mm and a thickness of 3 mm. Copper chrome alloy (chrome content of 1 wt %) was used as the backing plate, and indium soldering was used to directly connect the sputtering target and backing plate. The heating temperature was 230° C.

Next, similar to Example 2, a total of 25 points (1 point in the center, 8 points in ⅓ of the periphery, and 16 points in ⅔ of the periphery) were measured for each prescribed angle (θ) radially from the center thereof. The results are shown in Table 3. Further, the graph corresponding to Table 3 is shown in FIG. 6.

TABLE 3

| θ(deg) | Center | ⅓R | ⅔R |
|---|---|---|---|
| 0 | 2.95 | | |
| 0 | | 3.07 | |
| 45 | | 3.10 | |
| 90 | | 3.05 | |
| 135 | | 3.11 | |
| 180 | | 3.12 | |
| 225 | | 3.08 | |
| 270 | | 3.10 | |
| 315 | | 3.12 | |
| 0 | | | 3.25 |
| 22.5 | | | 3.22 |
| 45 | | | 3.21 |
| 67.5 | | | 3.21 |
| 90 | | | 3.20 |
| 112.5 | | | 3.21 |
| 135 | | | 3.31 |
| 157.5 | | | 3.29 |
| 180 | | | 3.30 |
| 202.5 | | | 3.29 |
| 225 | | | 3.27 |
| 247.5 | | | 3.25 |
| 270 | | | 3.23 |
| 292.5 | | | 3.23 |
| 315 | | | 3.22 |
| 337.5 | | | 3.19 |

Figure 6:
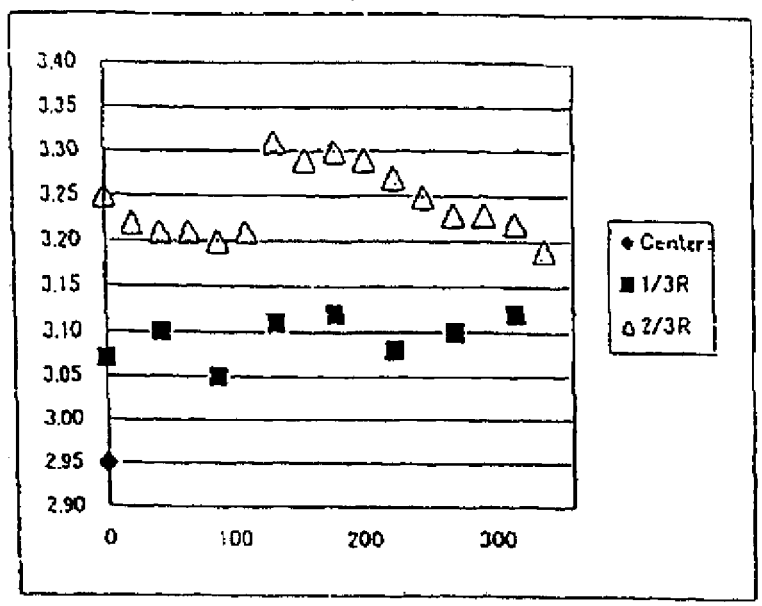
FIG. 6 is a diagram showing the results upon measuring the thickness of the nickel target in the case of not employing an aluminum plate (reinforcing plate) at a total of 25 points for each prescribed angle ($\theta$) radially from the center thereof with an ultrasonic thickness indicator.

As a result, as shown in Table 3 and FIG. 6, the maximum thickness was 3.31 mm, the minimum thickness was 2.95 mm, and the average was 3.183 mm. The displacement from the average thickness was 0.233 mm (7.3%) at maximum. Further, the difference between the maximum thickness and minimum thickness was 0.36 mm.

As described above, the warp amount was significantly large, and there were generation of abrasion marks and the like as with Comparative Example 1. This is considered to be because, since a reinforcing aluminum plate is not provided, significant cambering occurred during the connection of the sputtering target and backing plate, and, since grinding was conducted with the existence of such camber, the center portion became thin and the outer portion became thick (the opposite for the grinding side).

Next, the leakage flux of this discoid nickel target was measured with a gauss meter. The points measured were the same as the thickness measurement described above.

Figure 7:
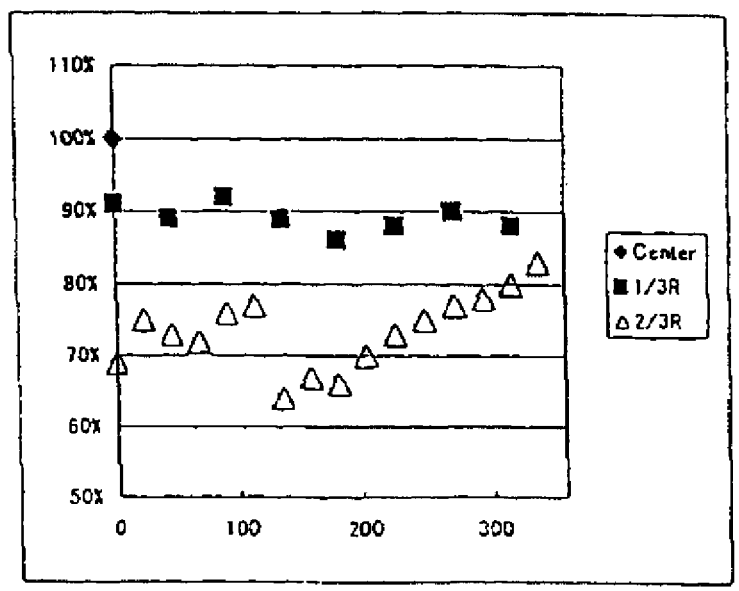
FIG. 7 is a diagram showing the measurement results of the leakage flux of above.

The relative values in the respective measuring points when the strongest value of the leakage flux is 100% were measured. The result was maximum 100% (center portion), minimum 64%, and average 79.5%. The difference between maximum and minimum was 36%. The results are shown in Table 4 and FIG. 7.

In comparison to Comparative Example 2 described above, a result was obtained in that the larger the change in thickness, the faster the leakage flux decreases.

TABLE 4

| θ(deg) | Center | ⅓R | ⅔R |
|---|---|---|---|
| 0 | 100% | | |
| 0 | | 91% | |
| 45 | | 89% | |
| 90 | | 92% | |
| 135 | | 89% | |
| 180 | | 86% | |
| 225 | | 88% | |
| 270 | | 90% | |
| 315 | | 88% | |
| 0 | | | 69% |
| 22.5 | | | 75% |
| 45 | | | 73% |
| 67.5 | | | 72% |
| 90 | | | 76% |
| 112.5 | | | 77% |
| 135 | | | 64% |
| 157.5 | | | 67% |
| 180 | | | 66% |
| 202.5 | | | 70% |
| 225 | | | 73% |
| 247.5 | | | 75% |
| 270 | | | 77% |
| 292.5 | | | 78% |
| 315 | | | 80% |
| 337.5 | | | 83% |

The present invention yields a superior effect in that, upon connecting a magnetic substance target to a backing plate, the flatness of the magnetic substance target during operation can be maintained until the magnetic substance target is connected to the backing plate by a relatively simple operation, and without generating any cambering of the magnetic substance target, and the flatness can be maintained after connecting a magnetic substance target and a backing plate.

The invention claimed is:

1. An assembly, comprising:
   a magnetic substance target, a backing plate, and an aluminum reinforcing plate,
   said magnetic substance target having an as-wrought structure with remnant stress sufficient to provide magnetic anisotropy necessary for enabling magnetron sputtering,
   wherein said magnetic substance target has a surface face, an opposite face bonded to said backing plate, and a thickness defined by a distance between said surface face and said opposite face, the thickness being 5 mm or less on average along said surface face and having a variation of 4% or less of said average thickness,
   wherein the surface face is bonded to the aluminum reinforcing plate such that the aluminum reinforcing plate is integral to the magnetic substance target, and
   wherein the opposite face is bonded to the backing plate after bonding the surface face to the reinforcing plate.

2. An assembly according to claim 1, wherein the magnetic substance target is made of a magnetic substance selected from the group consisting of iron, cobalt, nickel, platinum and alloys thereof.

3. The assembly according to claim 2, wherein the surface face is bonded to the aluminum reinforcing plate with an adhesive or brazing material.

* * * * *